(12) United States Patent
Ogawa et al.

(10) Patent No.: US 7,534,663 B2
(45) Date of Patent: May 19, 2009

(54) METHOD FOR MANUFACTURING A SURFACE MOUNT DEVICE

(75) Inventors: Yoshihiro Ogawa, Yokohama (JP); Kazuhiko Ueno, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 11/557,163

(22) Filed: Nov. 7, 2006

(65) Prior Publication Data

US 2007/0178629 A1 Aug. 2, 2007

(30) Foreign Application Priority Data

Jan. 31, 2006 (JP) ............................. 2006-023365

(51) Int. Cl.
*H01L 21/00* (2006.01)
(52) U.S. Cl. .................. 438/127; 438/113; 438/460; 257/E21.502; 257/E23.129
(58) Field of Classification Search ................ 438/113, 438/106
See application file for complete search history.

(56) References Cited

U.S. PATENT DOCUMENTS

| | | | | |
|---|---|---|---|---|
| 5,641,714 | A * | 6/1997 | Yamanaka | 438/14 |
| 5,776,798 | A * | 7/1998 | Quan et al. | 438/112 |
| 6,345,903 | B1 * | 2/2002 | Koike et al. | 362/249 |
| 6,599,768 | B1 * | 7/2003 | Chen | 438/22 |
| 6,613,609 | B1 * | 9/2003 | Laviron et al. | 438/125 |
| 6,638,780 | B2 * | 10/2003 | Fukasawa et al. | 438/26 |
| 6,867,072 | B1 | 3/2005 | Shiu et al. | |
| 7,200,924 | B2 * | 4/2007 | Masuko | 29/832 |
| 2001/0006456 | A1 | 7/2001 | Fujimoto et al. | |
| 2003/0080341 | A1 | 5/2003 | Sakano et al. | |
| 2003/0194835 | A1 * | 10/2003 | Kim et al. | 438/113 |

(Continued)

FOREIGN PATENT DOCUMENTS

EP 1213755 6/2002

(Continued)

OTHER PUBLICATIONS

European Search Report for EP Patent App. No. 07002141.5 (Jun. 15, 2007).

*Primary Examiner*—W. David Coleman
*Assistant Examiner*—Shaka Scarlett
(74) *Attorney, Agent, or Firm*—Cermak Kenealy Vaidya & Nakajima LLP

(57) ABSTRACT

A surface mount electronic device manufacturing method can produce surface mount devices at a high yield rate and high productivity by reducing warp of a circuit board. The reduced warp avoids problems in processes for dicing the circuit board. Surface mount LED devices made in accordance with the method can have high reliability and reduced non-uniformity in color tone. The method can include providing an adhesive sheet having window holes at predetermined intervals. The adhesive sheet can be adhered to the circuit board. An attachable board having window holes provided at corresponding positions to the window holes of the adhesive sheet can be adhered to the adhesive sheet. LED chips or other semiconductor devices, laser diodes, etc., can be mounted on the circuit board and located at positions corresponding to bottoms of the window holes. A thermosetting resin can be filled in the window holes for encapsulating the LED chips, etc. The surface mount devices can then be produced by dicing the circuit board.

24 Claims, 5 Drawing Sheets

U.S. PATENT DOCUMENTS

| | | | |
|---|---|---|---|
| 2004/0104460 A1* | 6/2004 | Stark | 257/678 |
| 2004/0238402 A1 | 12/2004 | Yunus | |
| 2005/0001329 A1* | 1/2005 | Matsuki et al. | 257/777 |
| 2005/0009244 A1* | 1/2005 | Shiobara et al. | 438/127 |
| 2005/0242362 A1* | 11/2005 | Shimizu et al. | 257/99 |

FOREIGN PATENT DOCUMENTS

| | | |
|---|---|---|
| JP | 2000196000 | 7/2000 |
| WO | WO02/21595 | 3/2002 |

\* cited by examiner

Fig. 4 (a) Conventional Art
Fig. 4 (b) Conventional Art
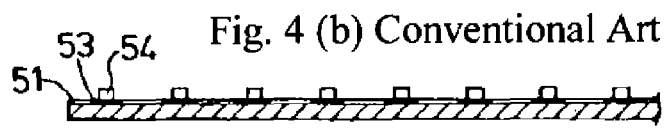
Fig. 4 (c) Conventional Art
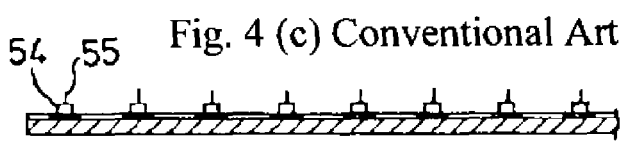
Fig. 4 (d) Conventional Art
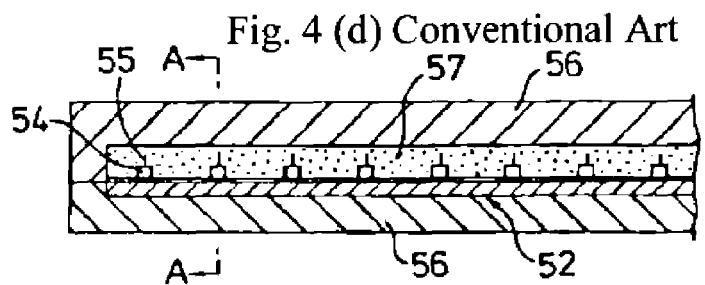
Fig. 4 (d)' Conventional Art
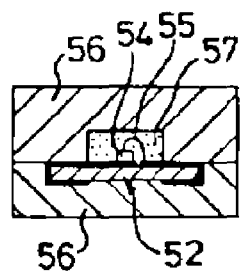
Section A-A
Fig. 4 (e) Conventional Art
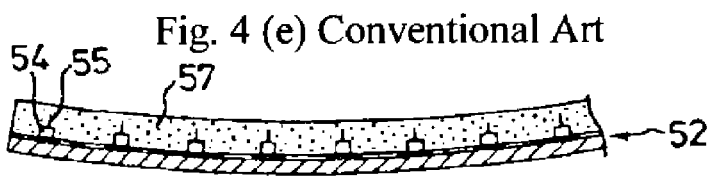

METHOD FOR MANUFACTURING A SURFACE MOUNT DEVICE

This application claims the priority benefit under 35 U.S.C. § 119 of Japanese Patent Application No. 2006-023365 filed on Jan. 31, 2006, which is hereby incorporated in its entirety by reference.

BACKGROUND

1. Field

The presently disclosed subject matter relates to a manufacturing method of surface mount devices including LEDs, laser diodes, etc.

2. Description of the Related Art

FIG. 4 shows a conventional manufacturing process for multiple surface mount LED devices according to one cycle. The process includes: FIG. 4(a) preparing a circuit board 52, by forming conductor patterns 51 on a surface of an insulating board 50; FIG. 4(b) mounting LED chips 54 at predetermined intervals on the respective die bonding pads 53 of the conductor patterns 51 via a conductive material or the like; FIG. 4(c) connecting an upper electrode of each LED chip 54 to the corresponding wire bonding pad of the conductor patterns 51 via a bonding wire 55; FIGS. 4(d) and (d') placing the circuit board 52 with the LED chips 54 mounted thereon in a mold 56, and encapsulating the LED chips 54 and the bonding wire 55 with an encapsulating resin 57 by way of resin transfer molding; FIG. 4(e) displacing the circuit board 52 from the mold 56, leaving the circuit board 52 in a normal/ambient temperature, and placing or forming a plurality of surface mount LED devices on the circuit board 52, in a state that the LED chips 54 and the bonding wires 55 are integrated by the encapsulating resin 57.

The circuit board 52 is diced by a dicing blade of a dicing machine at the predetermined intervals as shown in FIG. 5, with the encapsulating resin 57 being diced at the same time. The surface mount LED devices are respectively separated and completed as described in further detail, for example, in Japanese Patent Application Laid Open JP2000-196000 and its English translation, which are hereby incorporated in their entirety by reference.

In the manufacturing process of the surface mount LED devices described above, the circuit board 52 is sometimes warped, as shown in FIG. 4(e). The warp may be due to the formation process of the encapsulation resin. The warp can result in some problems in the last process for dicing the circuit board 52 and the encapsulating resin 57.

A more specific description of the warp will now be given. A thermosetting resin such as an epoxy resin is generally used for the encapsulating resin 57 which encapsulates the LED chips 54 and the bonding wires 55. The transfer mold for the encapsulating resin 57 is carried out by a heating process.

A characteristic of surface mount LED devices is that they are typically very thin devices. For the production of the very thin device, the circuit board 52 is also usually very thin, and includes LED chips 54 mounted on the mold bonding pads and bonding wires 55 connected to the wire bonding pads. For instance, a thin circuit board of 0.1 mm or less can be used for producing a thin surface mount LED device of 0.5 mm or less.

In the injection molding/transfer molding process for the thin circuit board 52 can include heating the insulating board 50, the conductor patterns 51, and the encapsulating resin 57 within the range of 100° C. to 200° C. and afterwards leaving the product in a normal or ambient temperature.

The coefficient of thermal expansion of the encapsulating resin heated within the range of 100° C. to 200° C. can be larger than the coefficient of the conductor patterns 51 provided on the surface of the insulating board 50. Thus, during the period when the device is left in the normal or ambient temperature, the encapsulating resin 57 shrinks more than the conductor patterns 51. Thus, the circuit board 52 can be curved such that it is concave in the direction of mounting the LED chips thereon, as shown in FIG. 4(e).

More specifically, in the case of molding a circuit board 52 that includes electrodes 51 (e.g. Cu/Ni/Au) formed on the insulating board 50 (for example, BT resin: made by Mitsubishi Gas Chemical Company, Inc) by the encapsulating resin 57 (for example, epoxy resin), the coefficient of thermal expansion of the insulating board 50 is almost equal to the coefficient of the encapsulating resin 57. The coefficient is about $6 \times 10^{-5}$ at 100° C. and approximately $15 \times 10^{-5}$ at 150° C. The coefficient of thermal expansion of the conductor patterns 51 (mainly Cu) formed on the surface of the insulating board 50 is approximately $1 \times 10^{-5}$ or less, even at 150° C.

Thus, the actual value of the coefficient of thermal expansion of the circuit board 52 that is composed of the insulating board 50 and the conductor patterns 51 is closer to the coefficient of the conductor patterns 51 than the coefficient of the insulating board 50 under the influence of the conductor patterns 51. Thus, a difference of the coefficient of thermal expansion between the circuit board 52 and the encapsulating resin 57 may result. This can be one of the reasons why the circuit board 52 has a warp generated during the process of being left in the normal or ambient temperature after the injection molding process.

The thickness of the conductor patterns 51 (from 30 μm to 40 cm in general) is not easily changed. Thus, the mechanical strength of the insulating board 50 weakens in accordance with thinning of the insulating board 50. The coefficient of thermal expansion of the circuit board 52 itself is closer to the coefficient of the conductor patterns 51 because of the increasing influence of the coefficient of the conductor patterns 51. As a result, the difference of the coefficient of thermal expansion between the circuit board 52 and the encapsulating resin 57 increases, and the warp of the circuit board 52 accordingly becomes greater during the process portion at which the device is left in a normal or ambient temperature.

When the circuit board 52 with the warp as described above is diced in the dicing process, the circuit board 52 may not be diced at a right angle to the edge of the dicing blade of the dicing machine. As a result, the edge of the dicing blade can be easily damaged, and the contour of some or all of the surface mount LED devices that are diced and separated become imperfect in shape. Thus, when dicing a circuit board 52 that includes the above-described warp after the injection molding process, the circuit board 52 with the warp is typically corrected, maintained in a plane, and diced. When the correction is carried out in a normal or ambient temperature, because the thickness of the encapsulating resin 57 is very thin, problems such as cracking of the encapsulating resin 57 and peeling of the encapsulating resin 57 from the circuit board 52 may be caused.

As a measure for countering the above noted characteristics and problems, a conventional method has included: reducing the warp by using a flexible resin for the encapsulating resin 57; adhering a dicing sheet (PET sheet with adhesive material on one side) to the circuit board 52; holding the circuit board 52 by vacuum suction on a stage of a dicing machine; and dicing the circuit board 52 and the encapsulating resin 57 using the dicing blade of the dicing machine. Another conventional method includes: heating the circuit board 52 on which LED chips 54 and the bonding wires 55 are encapsulated by the resin; adhering the circuit board 52 to the dicing sheet when in a state that the encapsulating resin is softened; and dicing the circuit board 52 while in a state of being held by vacuum suction on a stage of the dicing machine.

The method described above of encapsulating with the flexible resin may result in products with low reliability because of the weak strength for the surface mount LED devices.

The method of adhering the circuit board 52 with the warp thereof in the state of heating it to the dicing sheet requires heating equipment and also requires additional man-hours. In case of insufficient heating, problems such as cracking of the encapsulating resin 57 and peeling of the encapsulating resin 57 from the circuit board 52 may be caused when adhering the circuit board 52 to the dicing sheet when taking the warp-corrective actions. The circuit board 52 is heated at the time of adhesion to the dicing sheet, however the circuit board 52 is also held in a state of correcting the warp by vacuum suction on the stage of the dicing machine in the normal temperature during dicing. Thus, each surface mount LED device that is diced and separated has the possibility of peeling off from the dicing sheet and scattering by impact at the time of dicing.

The disclosed subject matter has been devised to consider the above and other problems and characteristics. Thus, an embodiment of the disclosed subject matter can include a manufacturing method of a circuit board on which a plurality of surface mount LED devices are formed in which warp of the circuit board 52 can be reduced so as not to cause various problems in the dicing process of the circuit board 52, and to reduce or change other associated problems and characteristics of the conventional methods.

SUMMARY OF THE DISCLOSED SUBJECT MATTER

The presently disclosed subject matter has been devised in view of the above and other problems and to make certain changes to the existing manufacturing methods. Another aspect of the disclosed subject matter includes methods of manufacture that provide various surface mount LED devices with high reliability and at high productivity rates.

According to an aspect of the disclosed subject matter, a method for manufacturing surface mount devices can include: preparing a circuit board by forming conductor patterns on a surface of an insulating board; adhering an adhesive sheet having window holes at predetermined intervals to the conductor patterns of the circuit board; adhering an attachable board having window holes provided at corresponding position to the window holes of the adhesive sheet, to the adhesive sheet; mounting at least one electronic component, such as an LED chip, on the circuit board located on the bottom of the window holes of the attachable board, thereby electrically connecting the LED chips to the circuit pattern; filling a thermosetting resin in the window holes to encapsulate the LED chips and wires; dicing the circuit board on which the LED chips are encapsulated by the resin, and separating it to provide respective LED devices.

In the above described exemplary method for manufacturing surface mount LED devices, the circuit board may be a thickness from substantially 0.35 mm to substantially 0.1 mm.

In the above described exemplary method for manufacturing surface mount LED devices, the insulation board used for the circuit board may be a thickness from substantially 0.2 mm to substantially 0.03 mm.

In the above described exemplary method for manufacturing surface mount devices, the encapsulating resin may be a transparent resin, or a mixture resin in which at least one of a diffuser, a phosphor, and/or a pigment for selectively absorbing light having a predetermined wavelength is mixed with the transparent resin.

In the above described exemplary method for manufacturing surface mount devices, the attachable board can include a transparent material, or a mixture material in which at least one of a diffuser, a phosphor, and/or a pigment for selectively absorbing light having a predetermined wavelength is mixed with the transparent material.

Another of the aspects of the disclosed subject matter includes a method for manufacturing surface mount devices that can include: preparing a circuit board on which at least one conductor pattern is formed; adhering an adhesive sheet with a wide window hole pattern to the conductor patterns of the circuit board; adhering an attachable board with a wide window hole pattern provided at corresponding positions with respect to the wide window hole pattern of the adhesive sheet, to the adhesive sheet; mounting electronic components, such as LED chips, on the circuit board which is located on the bottom of the wide window hole pattern of the attachable board, thereby connecting the LED chips to the circuit pattern; filling a thermosetting resin in the wide window hole pattern for encapsulating the LED chips and the bonding wires; dicing the circuit board with the encapsulating resin and separating it to provide respective LED devices.

In the immediately above described method for manufacturing surface mount LED devices, the same or similar variations to and characteristics of the method can be employed as set forth in paragraphs [0020] through [0023] above with respect to the embodiment of FIG. 2.

The above described dicing processes for a circuit board can result in a circuit board that has reduced warp and on which a plurality of surface mount LED devices (or other electronic components, such as other semiconductor devices) can be formed.

BRIEF DESCRIPTION OF THE DRAWINGS

These and other characteristics and features of the disclosed subject matter will become clear from the following description with reference to the accompanying drawings, wherein:

FIGS. 4(*a*)-(*e*) are side cross-section views depicting portions of a conventional method for manufacturing surface mount LED devices.

DETAILED DESCRIPTION OF EXEMPLARY EMBODIMENTS

An exemplary embodiment of the disclosed subject matter will now be described in detail with reference to FIGS. 1(*a*)-(*j*) and FIG. 2. FIG. 2 shows the processes corresponding to FIGS. 1(*a*)-(*f*).

Figure 1:
FIGS. 1(*a*)-(*j*) are side cross-section views showing respective processes of an exemplary method for manufacturing surface mount devices in accordance with an exemplary embodiment of the disclosed subject matter.
Figure 1:
Figure 1:
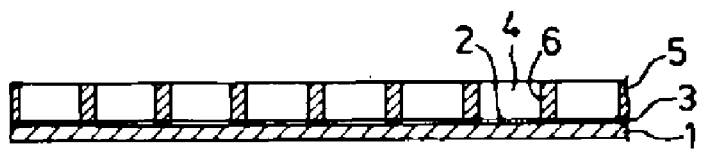
Figure 1:
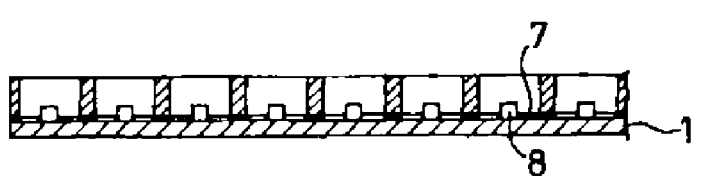
Figure 1:
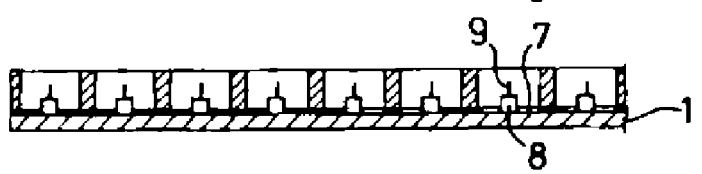
Figure 1:
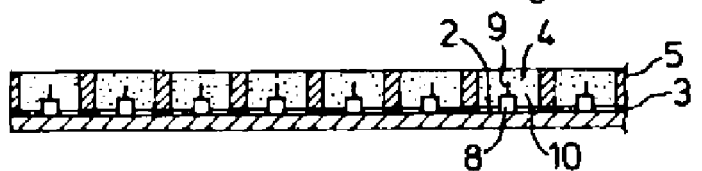
Figure 1:
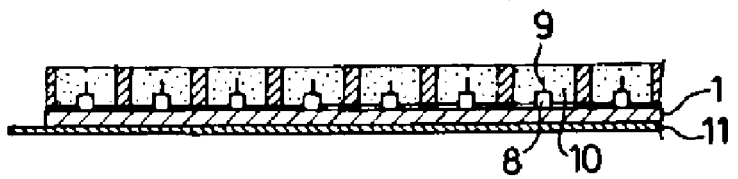
Figure 1:
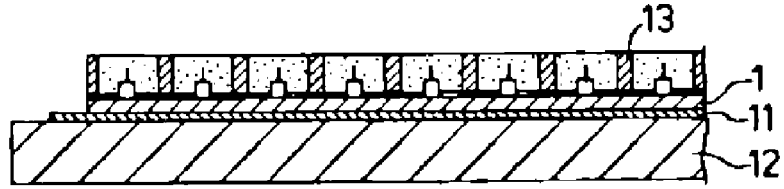
Figure 1:
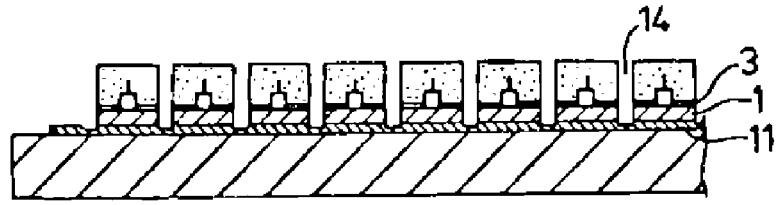
Figure 1:
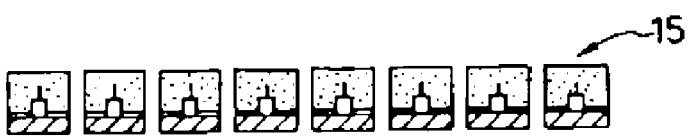
Figure 2:
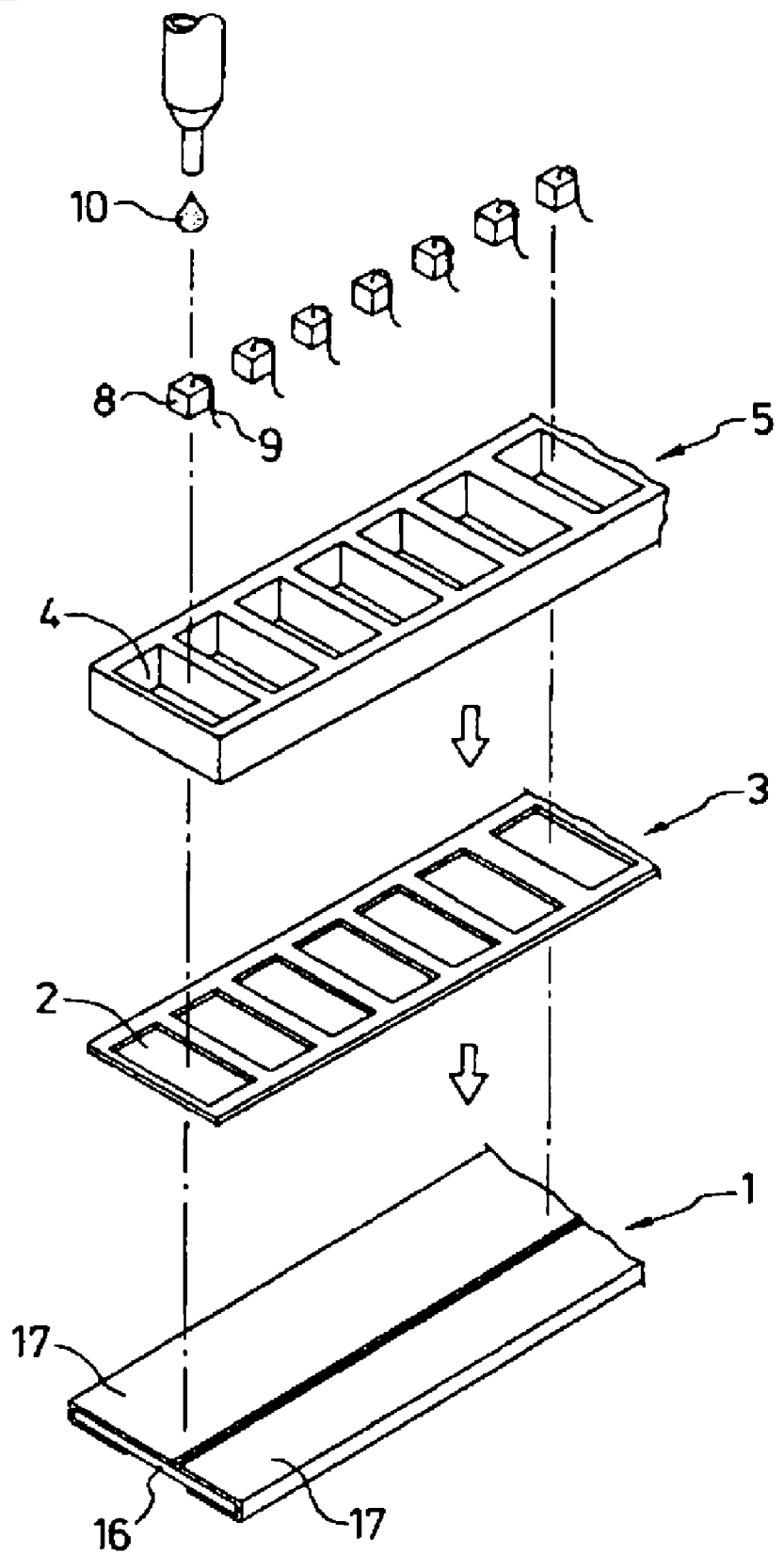
FIG. 2 is an exploded perspective view showing parts of the processes of the method for manufacturing surface mount devices according to the exemplary embodiment of FIGS. 1(*a*)-(*j*)

The process shown in FIG. 1(*a*) can include preparing a circuit board 1 by forming conductor patterns 17 on a top or bottom surface or both top and bottom surfaces of an insulating board 16, or by forming conductor patterns 17 on one of the top or bottom surfaces and at least one side surface of the insulating board 16, or by forming conductor patterns 17 on both the top and bottom surfaces and at least one of the side surfaces of the insulating board 16. The insulating board 16 can be made from various materials including, for example, paper phenol, paper epoxy, glass epoxy (FR-4 etc.), BT resin (made by Mitsubishi Gas Chemical Company, Inc.), and the like. The thickness of the insulating board 16 can be between substantially 0.2 mm to substantially 0.03 mm. Furthermore, the thickness of the circuit board 1 can be between substantially 0.35 mm to substantially 0.1 mm.

The process shown in FIG. 1(*b*) can include adhering an adhesive sheet 3 having window holes 2 formed at predetermined intervals to a surface on the conductor pattern(s) 17 of the circuit board 1.

The process shown in FIG. 1(*c*) can include: adhering an attachable board 5 that has window holes 4 to the adhesive sheet 3 such that the positions of window holes 4 correspond to positions of the window holes 2 of the adhesive sheet 3; the attachable board 5 can be heated within the range from a normal or ambient temperature (about 25° C.) to a temperature of about 100° C.; and adhering the circuit board 1 to the attachable board 5 via the adhesive sheet 3.

The attachable board 5 can have a coefficient of thermal expansion that is approximately equal with that of the circuit board 1. The attachable board 5 can also be made of resin that is harder than other resins used to make up other parts of the circuit board, and can be made by a transparent material. However, if the attachable board 5 is substantially planar at a normal or ambient temperature, the board 5 is not necessarily limited to the properties or characteristics described immediately above.

For example, it is not necessary for the attachable board 5 to be made from a transparent material. It is possible to include a high reflection surface on an inner surface 6 of the window holes 4 of the attachable board 5. The inner surface can be made from a non-transparent material, and the attachable board 5 itself can be made from the high reflection material, such as a white member material.

The window holes 2 provided in the adhesive sheet 3 and the window holes 4 provided in the attachable board 5 are not necessarily required to be the same shape. Each shape of the window holes 2 and 4 is not limited, and is decided based on design requirements, and can be square, rectangular, circular, elliptical, etc. However, when the circuit board is viewed from the upper side of the attachable board 5, the surface of the circuit board 1 can be viewed or exposed via the window holes 4 of the attachable board 5 and the window holes 2 of the adhesive sheet.

The process shown in FIG. 1(*d*) can include mounting at least one LED chip 8 on a respective die bonding pad (not shown in FIG. 1(*d*)) located on the exposed part 7 of the conductor pattern(s) 17 of the circuit board 1 via a conductive material or the like.

The process shown in FIG. 1(*e*) can include connecting an electrode of each LED chip 8 to a corresponding wire bonding pad (not shown in FIG. 1(*e*)) which is located on the exposed part 7 of the conductor pattern 17 and can be separated from the die bonding pad of the circuit board 1 via a bonding wire 9.

The process shown in FIG. 1(*f*) can include: filling a thermosetting resin 10 in window holes 4 of the attachable board 5 and window holes 2 of the adhesive sheet 3 by using a fixed quantity liquid dispensing device, such as a dispenser; heating the thusly formed circuit board; and thereby encapsulating the LED chips 8 and bonding wires 9 by the thermosetting resin 10. A transparent resin, or a transparent resin with a diffuser and/or a wavelength conversion material (e.g., a phosphor) and/or a pigment for selectively absorbing light having a predetermined wavelength, can be used for inclusion in or comprising the thermosetting resin 10. An epoxy resin or a silicon resin, etc., can be used for the transparent resin.

The process shown in FIG. 1(*g*) can include adhering the circuit board 1 with the thermosetting resin 10 that encapsulates both the LED chips 8 and the bonding wires 9 in the window holes to an adhesive side of a dicing sheet 11 (for example, a PET based sheet with an adhesive material on a side).

The process shown in FIG. 1(*h*) can include holding the dicing sheet 11 that is adhered to the circuit board 1 with a vacuum on a stage 12 of a dicing machine.

The process shown in FIG. 1(*i*) can include dicing the walls 13 constituting boundaries between adjacent window holes (composed of the window holes 4 of the attachable board 5 and the window holes 2 of the adhesive sheet 3). The dicing can be accomplished by a dicing blade of the dicing machine, from a top of the attachable board 5 to an inside of the dicing sheet 11, and through the adhesive sheet 3 and the circuit board 1. Thus, cutting ditches 14 from the tops of the attachable board 5 to the inside of the dicing sheet 11 can be formed, and plural surface mount LED devices 15 that have been diced and separated are then located on the dicing sheet 11.

The process shown in FIG. 1(*j*) can include removing the plural surface mount LED devices 15 from the dicing sheet 11 to complete the respective surface mount LED devices 15.

FIG. 2 is a perspective view showing the parts of the process from FIGS. 1(*a*)-(*f*) of a manufacturing method for the surface mount devices of the embodiment of FIG. 1(*a*)-(*j*), which can include the following processes: adhering the adhesive sheet 3 that is provided with plural window holes therein at predetermined intervals to the circuit board 1 in which conductor patterns 17 are formed on the insulating board 16; adhering the attachable board 5 that is provided with plural window holes therein at predetermined intervals to the adhesive sheet 3; mounting the LED chips 8 on the conductor patterns 17 of the circuit board 1, which is located at the bottom surfaces of the respective window holes which are composed of the window holes 2 of the adhesive sheet 3 and the window holes 4 of the attachable board 5; connecting the LED chips 8 to corresponding wire bonding pads via the bonding wires 9; filling the thermosetting resin in the respective wide window holes; and, encapsulating the LED chips 8 and the bonding wires 9 with the thermosetting resin.

The method for manufacturing the surface mount LED devices by the exemplary embodiment shown in FIG. 1 and FIG. 2 can also include: filling the thermosetting resin 10 in each window hole which is composed of a bottom surface formed by the circuit board 1 and side surfaces formed by the walls 13 to encapsulate the LED chips 8 and the bonding wires 9. The area where the circuit board 1 contacts the thermosetting resin 10 that is filled in the window hole(s) can be far smaller than the area where the conductor pattern 51 contacts the encapsulating resin 57 in the conventional method as described above in the "description of the related art" section.

Thus, when the thermosetting resin 10 is left in the normal or ambient temperature after the heating process, the amount of shrinkage of the thermosetting resin 10 can be less than the amount of shrinkage experienced in the conventional method(s). The amount of the warp of the circuit board 1 in contact with the thermosetting resin 10 can thus also be extremely small. The method for manufacturing the surface mount devices as shown in the exemplary embodiment is an excellent method for preventing various problems in the dicing process, while providing a high yield rate, high productivity, and high reliability.

Figure 3:
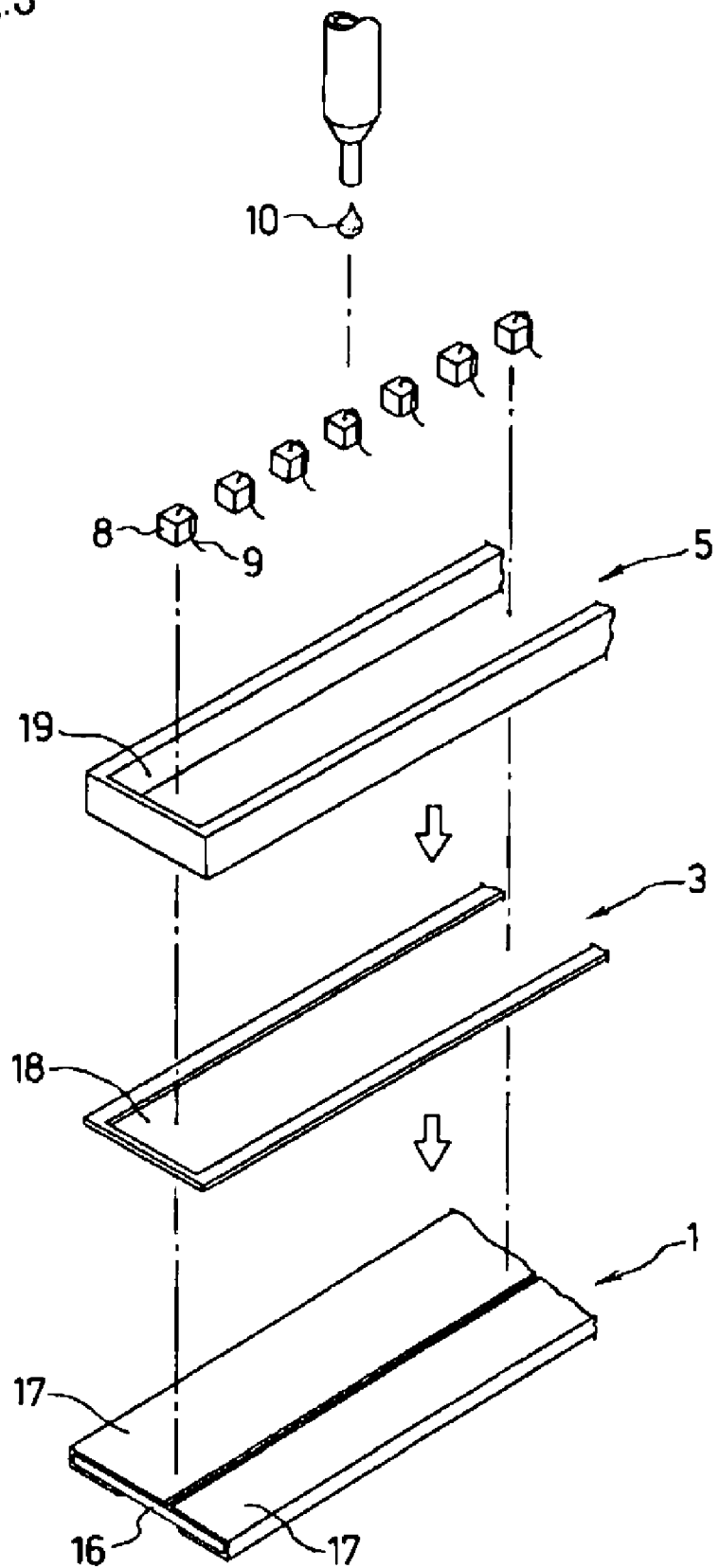
FIG. 3 is an exploded perspective view showing parts of processes of another exemplary method for manufacturing surface mount devices according to another exemplary embodiment of the disclosed subject matter.
Figure 5:
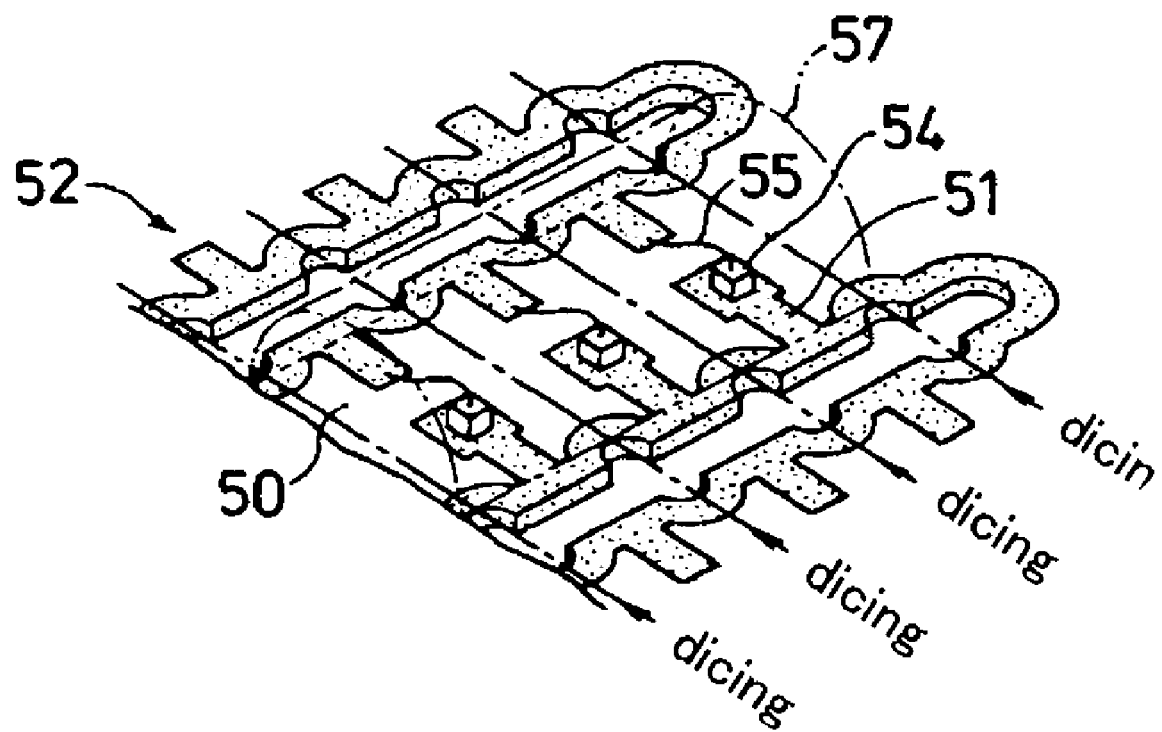
FIG. 5 is a perspective view depicting a part of the conventional method for manufacturing surface mount LED devices shown in FIGS. 4(*a*)-(*e*).

Another exemplary embodiment of the disclosed subject matter will now be described with respect to FIG. 3. FIG. 3 shows parts of processes corresponding to the process from FIGS. 1(a) to 1(f) (and also corresponding to the parts of the processes shown in FIG. 2).

The embodiment of a method for manufacturing the surface mount devices as shown in FIG. 3 is similar to that of the embodiment shown in FIG. 2 in some aspects but differ in other aspects. For example, in the embodiment of FIG. 2, the adhesive sheet 3 and the attachable board 5 are provided with plural window holes at predetermined intervals. In the embodiment of FIG. 3, the circuit board 1 that includes conductor patterns 17 on the insulating board 16 can be adhered to an adhesive sheet 3 in which a wide window hole 18 is provided. An attachable board 5 that includes a corresponding wide window hole 19 can be adhered to the adhesive sheet 3. Plural electronic components, such as LED chips 8, can be mounted at predetermined intervals on the conductor patterns 17 of the circuit board 1, which forms a bottom surface of the wide window hole (composed of the wide window hole 18 of the adhesive sheet 3 and the wide window hole 19 of the attachable board 5). Some or all of the LED chips 8 can be connected to a corresponding wire bonding pad via the bonding wire 9. A thermosetting resin can be filled in the wide window hole to integrate/encapsulate the plural LED chips and the bonding wires 9 with the thermosetting resin.

Differences between the embodiment of FIG. 2 and the embodiment of FIG. 3 include plural window holes included in the adhesive sheet 3 and the attachable board 5 at predetermined intervals in the embodiment of FIG. 2 while only one wide window hole is included in the adhesive sheet 3 and the attachable board 5 in the embodiment of FIG. 3. The other processes can be similar or the same.

The wide window hole 18 provided in the adhesive sheet 3 and the wide window hole 19 provided in the attachable board 5 are not necessarily the same shape. The particular shape of the wide window hole 18 and 19 is not limited, and can be decided based on design choice. For example, the window can be rectangular, circular, square, triangular, elliptical, non-symmetrical, etc.

The area where the circuit board 1 contacts the thermosetting resin 10 in the embodiment of FIG. 3 can be larger than the area in the embodiment of FIG. 2. Thus, when the thermosetting resin 10 is left in the normal or ambient temperature after the heating process, the amount of shrinkage of the thermosetting resin 10 in the embodiment of FIG. 3 should be greater than the amount of shrinkage in the embodiment of FIG. 2. However, the amount of the shrinkage can be decreased by using an attachable board 5 that has a coefficient of thermal expansion equal to that of the circuit board 1. Thus, the amount of the warp of the circuit board 1 in the embodiment of FIG. 3 can also be less than the amount of the warp in the above-described conventional methods, although the embodiment of FIG. 2 is typically more effective than that of the embodiment of FIG. 3.

In the above described embodiments, it is possible to use an adhesive different from the adhesive sheet 3. Similarly, it is also possible to attach the adhesive sheet 3 or paint the adhesive to the attachable board 5 instead of to the circuit board 1.

In the above-described embodiments, the processes can include the process in which the LED chips are connected to wire bonding pads via bonding wires. However, when the LED chips are flip chips such as GaN based LEDs, etc., the process of the wire bonding as described above is not necessary.

In the above-described embodiments, LED chips 8 which are used as light emitting devices are mounted on the circuit board 1. However, it is possible to mount photodiode chips, phototransistor chips, etc., that can be used as light detecting devices. In addition other light emitting devices such as laser diodes, etc., and other types of semiconductor chips in general can be used in place of the LED chips 8 described above for use as the electrical component without departing from the spirit and scope of the presently disclosed subject matter.

In the above-described embodiments, the dicing process is carried out by the edge of the dicing blade of the dicing machine. The method is not limited to this dicing process. For example, it is possible to dice by using a laser dicing machine that does not use a blade and/or by using other known dicing processes or apparatus.

In the embodiments described above, a transparent resin is used for encapsulating the LED chips 8 and the bonding wires 9. It is also conceivable that the resin be mixed with one or more materials, including a diffuser, a phosphor, a pigment for selectively absorbing light having a predetermined wavelength, other wavelength conversion materials, etc. It is also possible for the attachable board 5 to be used with the transparent resin and/or the mixture resin (i.e., resin in which one or more of the diffuser, the phosphor, the pigment for selectively absorbing light having a predetermined wavelength, and the like, is mixed with the transparent resin).

As described above, the conventional circuit board 52 with the encapsulating resin can include a warp generated on itself during the manufacturing process in which the device is left at normal or ambient temperature. Thus, various problems may occur when attempting to correct for the warp of the circuit board 52, for example, during dicing. In the above-described exemplary embodiments of the disclosed subject matter, because the amount of the warp of the circuit board 1 can be small at normal or ambient temperature, the circuit board may not be required to be corrected. Thus, the above-described various problems and characteristics can be avoided or minimized, and the yield rate can be improved.

In the above-described conventional methods, the encapsulating resin for encapsulating the LED chips and the bonding wires is adhered to the circuit board only by the sticking power of the resin with the circuit board. In an embodiment of the presently disclosed subject matter, the encapsulating resin can be adhered to the circuit board by the sticking power of both the circuit board and the attachable board which is adhered on the circuit board via the adhesive sheet. Thus, reliability of the product may improve because of strengthened sticking power between the encapsulating resin and the circuit board.

When the encapsulating resin is disposed on the circuit board that includes conductor patterns formed on an insulating board, the sticking power of the encapsulating resin with the insulating board is stronger than the sticking power of the resin with the conductor patterns. Thus, in order to prevent the encapsulating resin from peeling off the circuit board, the proportion of contact area between the resin and the conductor patterns is reduced as compared to the contact area between the encapsulating resin and the circuit board. However, as the proportion of contact area of the conductor patterns and encapsulating resin relative to the contact area of the encapsulating resin and the circuit board increases in accordance with the miniaturization of surface mount devices, the sticking power between the encapsulating resin and the circuit board also weakens.

In the above-described embodiments of methods for manufacturing surface mount devices, the sticking power between the encapsulating resin and the circuit board has been strengthened by allowing the encapsulating resin to contact both the circuit board on which LED chips are mounted and the attachable board, which is adhered on the circuit board via the adhesive sheet. Even if the proportion of the contact area of the encapsulating resin and conductor patterns relative to the contact area of the encapsulating resin and the circuit board increases in accordance with the miniaturization, high reliability of the product can be secured because it may be able to prevent the encapsulating resin from peeling off the circuit board.

The mechanical strength of the surface mount LED device can be increased by using an attachable board that is harder than the encapsulating resin. Thus, the strength of the product can be secured even in the advancement of miniaturization abilities.

In a surface mount LED device, it is common to display an electrode mark (cathode mark) at a position that can be distinguished from the top of the device. The mark is often displayed on the circuit board under the encapsulating resin because of the restriction on the size of the miniaturized surface mount LED device. When a mixture resin in which a material like phosphor is mixed with the transparent resin is used for the encapsulating resin, the light emitted from LED chip of the light source activates the phosphor, the light wavelength is converted, and a surface mount LED device that emits light of a different color as compared to the light emitted from the LED chip is produced. In this case, it becomes difficult to distinguish the mark under the encapsulating resin. In addition, it is more difficult to distinguish the mark due to the increasing density of the phosphor. Then, according to an aspect of the disclosed subject matter, the mark under the encapsulating resin can be distinguished via the adhesive sheet, by making the attachable board from a transparent material. Thus, the electrode of the surface mount LED device can be recognized both before and after mounting it. In addition, a mounting direction of the LED device can be confirmed.

In the embodiment of FIG. 3, at least a couple of opposite sides of the encapsulating resin can be exposed to the outside (atmosphere). Most of the light that is emitted from the LED chips and which reaches the sides of the encapsulating resin is emitted from the sides to the outside, and is not emitted in great quantity from the upper surface. That is, most of light that reaches the sides of the encapsulating resin contain very little reflected light, and is composed solely or mostly of direct light from the LED chip.

Thus, there is not a large difference between optical path lengths that reach various positions at the upper surface of the encapsulating resin among the light emitted from the LED chip. The ratio of light whose wavelength is converted by the phosphor is approximately the same along the surface of the device because no large difference of optical path lengths exists. Thus, the above-described embodiments of the disclosed subject matter can provide surface mount LED devices that have a reduced non-uniformity in the color tone of light emitted from the upper surface of the LED devices.

It should be understood that various different layers or sheets can be interposed between the above-described circuit board 1, adhesive sheet(s) 3 and/or attachable board 5 without departing from the spirit and scope of the disclosed subject matter.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A method for manufacturing a surface mount electronic device comprising:
   providing an attachable board with a plurality of window holes at predetermined intervals, a circuit board, an adhesive material, and at least one electronic component;
   attaching the attachable board to the circuit board with the adhesive material;
   disposing the at least one electronic component on the circuit board and in one of the plurality of window holes of the attachable board;
   filling an encapsulating resin into the one of the plurality of window holes to form a sidewall to encapsulate the at least one electronic component located in the one of the plurality of window holes;
   dicing the circuit board and at least the sidewall of the attachable board at a position at which the attachable board forms one of the plurality of window holes; and
   separating the circuit board to provide at least one electronic device.

2. The method for manufacturing a surface mount electronic device according to claim 1, wherein the circuit board has a thickness between substantially 0.35 mm and substantially 0.1 mm.

3. The method for manufacturing a surface mount electronic device according to claim 1, wherein the circuit board includes an insulation board having a thickness between substantially 0.2 mm and substantially 0.03 mm.

4. The method for manufacturing a surface mount electronic device according to claim 1, wherein the encapsulating resin is at least one of a transparent resin and a mixture resin, and the mixture resin includes a resin mixed with at least one of a diffuser, a phosphor, and a pigment for selectively absorbing light having a predetermined wavelength.

5. The method for manufacturing a surface mount electronic device according to claim 4, wherein the attachable board includes at least one of a transparent material and a mixture material, and the mixture material includes a resin mixed with at least one of a diffuser, a phosphor, and a pigment for selectively absorbing light having a predetermined wavelength.

6. A method for manufacturing a surface mount electronic device comprising:
   providing an attachable board with one wide window hole defined by a sidewall, a circuit board, an adhesive material, and at least one electrical component;
   attaching the attachable board to the circuit board with the adhesive material;

disposing at least one line of electronic components on the circuit board and in the one wide window hole of the attachable board, and the line of electronic components is surrounded with the attachable board;

filling an encapsulating resin in the one wide window hole to encapsulate the at least one electronic component located in the wide window hole;

dicing the circuit board and at least a portion of the attachable board at a position located at the sidewall and between adjacent electronic components and at which the attachable board forms the one wide window hole; and separating the circuit board to provide at least one electronic device.

7. The method for manufacturing a surface mount electronic device according to claim 6, wherein the circuit board has a thickness between substantially 0.35 mm and substantially 0.1 mm.

8. The method for manufacturing a surface mount electronic device according to claim 6, wherein the circuit board includes an insulation board having a thickness between substantially 0.2 mm and substantially 0.03 mm.

9. The method for manufacturing a surface mount electronic device according to claim 6, wherein the encapsulating resin is at least one of a transparent resin and a mixture resin, and the mixture resin includes a resin mixed with at least one of a diffuser, a phosphor, and a pigment for selectively absorbing light having a predetermined wavelength.

10. The method for manufacturing a surface mount electronic device according to claim 9, wherein the attachable board includes at least one of a transparent material and a mixture material, and the mixture material includes a resin mixed with at least one of a diffuser, a phosphor, and a pigment for selectively absorbing light having a predetermined wavelength.

11. The method for manufacturing a surface mount electronic device according to claim 1, wherein the electronic component is an LED chip, and the electronic device is an LED device.

12. The method for manufacturing a surface mount electronic device according to claim 6, wherein the electronic component is an LED chip, and the electronic device is an LED device.

13. The method for manufacturing a surface mount electronic device according to claim 1, wherein the electronic component is disposed at a bottom portion of the one of the plurality of window holes.

14. The method for manufacturing a surface mount electronic device according to claim 6, wherein the electronic component is disposed at a bottom portion of the one wide window hole.

15. The method for manufacturing a surface mount electronic device according to claim 1, further comprising:
providing a dicing sheet; and
locating the circuit board adjacent to the dicing sheet, wherein dicing includes dicing the dicing sheet.

16. The method for manufacturing a surface mount electronic device according to claim 6, further comprising:
providing a dicing sheet; and
locating the circuit board adjacent to the dicing sheet, wherein dicing includes dicing the dicing sheet.

17. The method for manufacturing a surface mount electronic device according to claim 1, wherein providing includes providing a plurality of electronic components, and disposing includes disposing respective ones of the plurality of electronic components in each of the plurality of holes.

18. The method for manufacturing a surface mount electronic device according to claim 6, wherein providing includes providing a plurality of electronic components, and disposing includes disposing all of the plurality of electronic components in the one wide window hole.

19. The method for manufacturing a surface mount electronic device according to claim 1, wherein the circuit board is in direct contact with the adhesive material and the adhesive material is in direct contact with the attachable board.

20. The method for manufacturing a surface mount electronic device according to claim 6, wherein the one wide window hole is a single window hole formed by walls that are exposed from exterior most side portions of the electronic device.

21. The method for manufacturing a surface mount electronic device according to claim 6, wherein the attachable board is transparent.

22. The method for manufacturing a surface mount electronic device according to claim 6, wherein the attachable board has a thermal coefficient of expansion that is equal to a thermal coefficient of expansion of the circuit board.

23. The method for manufacturing a surface mount electronic device according to claim 1, wherein the attachable board is transparent.

24. The method for manufacturing a surface mount electronic device according to claim 1, wherein the attachable board has a thermal coefficient of expansion that is equal to a thermal coefficient of expansion of the circuit board.

* * * * *